United States Patent [19]

Nakatsubo et al.

[11] 4,187,800
[45] Feb. 12, 1980

[54] DEVICE FOR MANUFACTURING PHOTOSENSITIVE SCREEN

[75] Inventors: Toshio Nakatsubo; Masaji Nishikawa, both of Hachioji; Eiichi Sato, Tama, all of Japan

[73] Assignee: Olympus Optical Co., Ltd., Tokyo, Japan

[21] Appl. No.: 796,481

[22] Filed: May 12, 1977

[30] Foreign Application Priority Data

May 18, 1976 [JP] Japan ................................ 51-56015

[51] Int. Cl.$^2$ ............................................. C23C 13/08
[52] U.S. Cl. .................................................. 118/724
[58] Field of Search ................. 118/48, 49, 49.1, 49.5; 427/255

[56] References Cited

U.S. PATENT DOCUMENTS

| | | | |
|---|---|---|---|
| 2,263,008 | 11/1941 | McRae | 118/49 |
| 2,479,541 | 8/1949 | Osterberg | 118/49 |
| 2,572,497 | 10/1951 | Law | 427/255 X |
| 2,746,420 | 5/1956 | Steigerwald | 118/49.1 |
| 2,847,325 | 8/1958 | Riseman et al. | 118/48 X |
| 2,885,997 | 5/1959 | Schwindt | 118/49 |
| 3,371,649 | 3/1968 | Gowen | 118/49.1 |
| 3,568,632 | 3/1971 | Cawthon | 118/49 |
| 3,690,635 | 9/1972 | Harker et al. | 118/49.1 X |
| 3,695,910 | 10/1972 | Louderback et al. | 118/491 |

Primary Examiner—Dorsey Newton
Attorney, Agent, or Firm—Haseltine, Lake & Waters

[57] ABSTRACT

A device for manufacturing a photosensitive screen comprising a vapor supply source and a mesh-shaped electric conductive substrate arranged above the vapor supply source along at least one portion of a circular plane having a center located at the vapor supply source.

4 Claims, 7 Drawing Figures

U.S. Patent  Feb. 12, 1980  Sheet 1 of 2  4,187,800
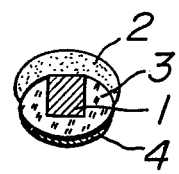
FIG.1
FIG.2a
PRIOR ART
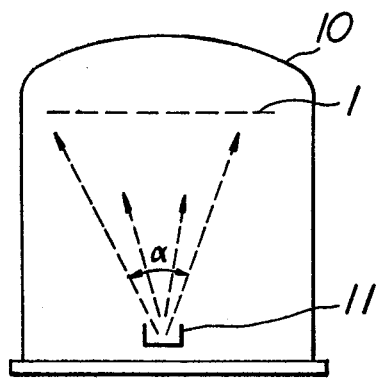
FIG.2b
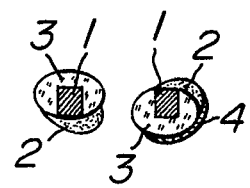
FIG.3
PRIOR ART
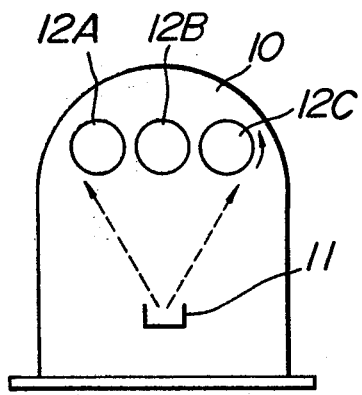
FIG.4
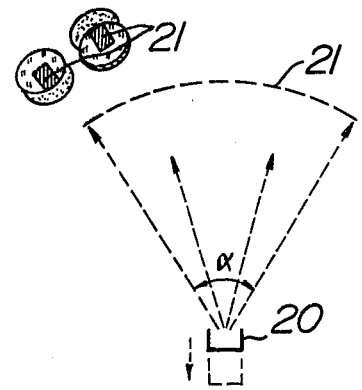

DEVICE FOR MANUFACTURING PHOTOSENSITIVE SCREEN

FIELD OF THE INVENTION

This invention relates to a device for manufacturing a photosensitive screen used for an electrographic apparatus for the purpose of controlling a flow of corona ions from a corona discharge electrode to a record medium.

BACKGROUND

In such well known electrographic apparatus, a flow of corona ions is modulated by a first electrostatic latent image formed on the photosensitive screen to produce, on a record medium having a layer of dielectric material, a second electrostatic latent image corresponding to an image to be recorded. The photosensitive screen is composed of a mesh-shaped electric conductive substrate coated with an insulating layer, a photosensitive layer, an electric conductive layer, etc. in succession by spraying or by vapor deposition under vacuum. The photosensitive screen used for formation of copies of a manuscript, etc. has meshes whose practical size is preferably 100 to 300 meshes. In order to coat such fine meshes with each of the above mentioned layers, it is extremely efficient to use the vacuum vapor deposition. Substances utilizable for the vacuum vapor deposition are, for example, metals such as Al, Ag, Au, In, etc. and oxides of such metals for the electric conductive layer, Se, Se-Te, Se-As for the photosensitive layer and various kinds of inorganic substance and compounds thereof for the insulating layer. The use of an electric conductive layer formed of metals having a low melting point and an excellent stability and a photosensitive layer formed of Se or Se alloy is of high utility value in practice.

In the case of vapor depositing in vacuum on one side surface of a flat mesh-shaped substrate formed of an etched electric conductive plate, a photosensitive layer and on the opposite side surface thereof an insulating layer and an electric conductive layer in succession to form a photosensitive screen of four layer construction, that portion of the mesh-shaped substrate which is located directly above a vapor supply source becomes regular in cross sectional shape, but each end of the flat mesh-shaped substrate becomes deformed in cross-sectional shape. Since a flow of corona ions is controlled by electric potential applied to each portion of the cross-sectional shape of the mesh-shaped substrate, the deformation in cross-sectional shape of the photosensitive screen results in different mode of modulation of the flow of corona ions. In addition, the deformation in cross-sectional shape of the photosensitive screen exerts adverse influence upon the electric charge on the photosensitive layer and the electric potential attenuation characteristics (brightness attenuation and darkness attenuation) thereof. As a result, the efficient formation of ion current patterns corresponding to optical image could not be attained.

SUMMARY OF THE INVENTION

An object of the invention, therefore, is to provide a device for manufacturing a photosensitive screen which is uniform in cross-sectional shape and hence is uniform in electric charge on its photosensitive layer and the electric potential attenuation characteristics thereof.

A feature of the invention is to provide a device for manufacturing a photosensitive screen comprising a vacuum vapor deposition means and forming on a mesh-shaped electric conductive substrate a photosensitive layer, an electric conductive layer, etc. by vapor deposition under vacuum in said means, characterized in that said mesh-shaped electric conductive substrate is arranged above said vapor supply source along at least one portion of a circular plane having a center located at said vapor supply source.

BRIEF DESCRIPTION OF THE DRAWINGS

The invention will now be described in greater detail with reference to the accompanying drawings, wherein:

FIG. 1 is a cross-sectional view showing one embodiment of a photosensitive screen to be manufactured by a device according to the invention;

FIG. 2a is a diagrammatic view showing a conventional device for manufacturing a photosensitive screen;

FIG. 2b is a cross-sectional view showing two successive steps of manufacturing a photosensitive screen by the conventional device shown in FIG. 2a;

FIG. 3 is a diagrammatic view showing another conventional device for manufacturing an Se photosensitive screen;

FIG. 4 is a diagrammatic view showing a basic construction of a device for manufacturing a photosensitive screen according to the invention and two successive steps of manufacturing the photosensitive screen by the same device;

DETAILED DESCRIPTION

Figure 5:
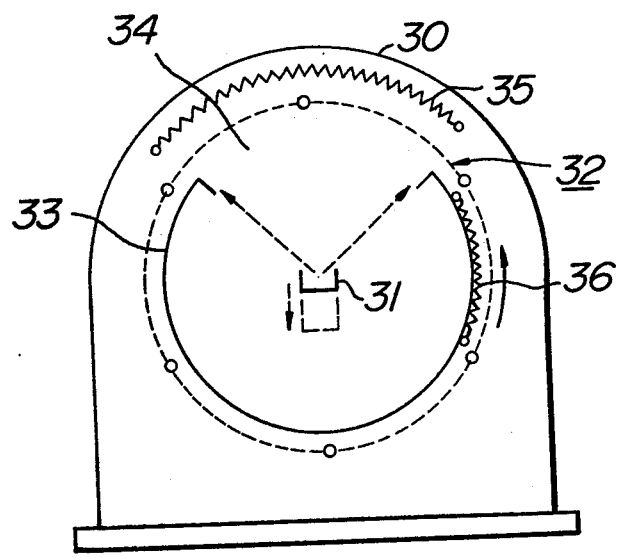
FIG. 5 is a diagrammatic view showing another embodiment of the device according to the invention.
Figure 6:
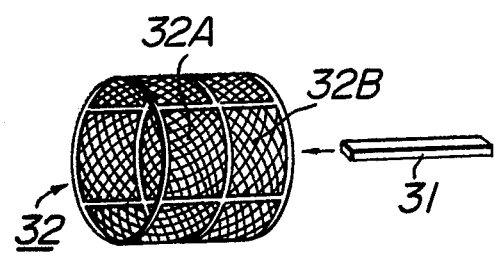
FIG. 6 is a perspective view showing a mesh-shaped cylinder and a vapor supply source usable for the device according to the invention shown in FIG. 5.

In FIG. 1 is shown one embodiment of a photosensitive screen in section to be manufactured by a device according to the invention. A mesh-shaped substrate 1 formed by etching an electric conductive plate or by weaving an electric conductive wire is provided at one side surface with a photosensitive layer 2 vapor deposited under vacuum thereon and provided at its opposite side surface with an insulating layer 3 and an electric conductive layer 4 vapor deposited under vacuum in succession to provide a photosensitive screen of four layer construction.

In FIG. 2a is shown a conventional vacuum vapor deposition means for manufacturing the above mentioned photosensitive screen of four layer construction. The vacuum vapor deposition means comprises a bell jar 10 held under vacuum and including a vapor supply source 11 for an evaporating substance to be vapor deposited and a flat mesh-shaped electric conductive substrate 1 arranged above the vapor supply source 11. If the vapor is emitted from the vapor supply source 11 with an evaporation angle α, vapor deposited at the center portion functions to form a desired four layer construction as shown in FIG. 1. But, the vapor deposited at the end portions functions to deform such four layer construction into a cross-sectional shape shown in FIG. 2b. Such cross-sectional shape of the photosensitive screen results in a different mode of modulation of the flow of corona ions and hence is not desirous in practice. In FIG. 2b, at the left side is shown an intermediate step of manufacturing a three layer construction prior to the final step of manufacturing the four layer construction of the photosensitive screen shown in FIG. 2b, at the right side.

A flow of ions is controlled in accordance with the electric potential applied to each layer of the cross-sectional shape of the photosensitive screen, so that the deformation of the cross-sectional shape thereof results in change in the mode of modulation. In addition, such deformation of the cross-sectional shape of the photosensitive screen exerts an adverse influence on the electric charge on its photosensitive layer and the electric potential attenuation characteristic (bright attenuation, dark attenuation), thereof. As a result, the deformation of the cross-sectional shape of the photosensitive screen is extremely undesirable.

In FIG. 3 is shown a construction of a conventional vapor deposition device for manufacturing an Se photosensitive drum. The device comprises a bell jar 10 including a vapor supply source 11 arranged therein and cylindrical drum substrates 12A, 12B, 12C rotatably supported above the vapor supply source 11 with respective rotational shafts aligned on a horizontal line. If such conventional vapor deposition means is utilized for manufacturing a screen-shaped photosensitive drum, it is possible to form a vapor deposition layer coated on each of the screen drums uniform in thickness. Such conventional vapor deposition means, however, has the disadvantage that an incident angle of the flow of vapor to any one point on each of the drums becomes changed during the rotation thereof and hence the layer deposited on the drum is extended beyond a given region to deform the cross-sectional shape thereof, and that means for preventing the vapor substance passed through the meshes of the screen drum from being adhered onto the opposed surface of the screen drum and means for controlling temperature become complex in construction and troublesome in operation. In FIG. 4 is diagrammatically shown a basic construction of one embodiment of a device for manufacturing a photosensitive screen according to the invention. The device according to the present embodiment comprises a vapor supply source 20 and a mesh-shaped electric conductive substrate 21 arranged above the vapor supply source 20 along an arcuate passage having a center located at the vapor supply source 20. Such arrangement of the mesh-shaped electric conductive substrate 21 makes it possible to form an incident angle of the flow of vapor both at the center portion and the end portions of the mesh-shaped electric conductive substrate 21 which are equal and hence manufacture a photosensitive screen having the desired correct cross-sectional shape shown in FIG. 1.

On the contrary, in the conventional device shown in FIG. 2a, the distance between the end portion of the flat screen substrate 1 and the vapor supply source 11 is longer than that between the center portion of the screen substrate 1 and the vapor supply source 11, so that the layer vapor deposited on the end portion of the screen substrate 1 becomes considerably smaller in thickness than the vapor deposited on the center portion thereof.

In the device according to the invention, the distance between the vapor supply source 20 and the mesh-shaped substrate 21 is equal irrespective of the position along the mesh-shaped substrate 21, so that the difference between the amount of substance vapor deposited on one portion of the mesh-shaped substrate 21 and the amount of substance vapor deposited on any other portions becomes extremely small. Such difference is due to the shape of a boat constituting the vapor supply source 20 that tends to coat the center portion of the mesh-shaped substrate 21 with a slightly larger amount of substance than the end portions thereof. If it is a problem to compensate for such minute difference in the amount of vapor deposited substance, the vapor supply source 20 may be slightly moved downwardly in a vertical direction to a position shown by dotted lines. Then, the distance between the end portion of the arcuate mesh-shaped substrate 21 and the vapor supply source 20 becomes slightly shorter than that between the center portion of the arcuate mesh-shaped substrate 21 and the vapor supply source 20, and as a result, the layer vapor deposited on all over the surface of the arcuate mesh-shaped substrate 21 becomes more uniform.

In FIG. 5 is diagrammatically shown another embodiment of the device for manufacturing a photosensitive screen according to the invention. The device comprises a bell jar 30 of a vacuum means in substantially center of which is arranged a vapor supply source 31. In the present embodiment, the vapor supply source 31 is composed of an elongate boat as shown in FIG. 5 and arranged at the rotational axis of a mesh-shaped cylindrical substrate 32 formed of a cylindrical frame with a plurality of mesh-shaped substrates 32A, 32B . . . detachably mounted thereon. The cylindrical substrate 32 is rotatably supported and rotated by a suitable driving mechanism in a continuous or intermittent manner. In the case of vapor depositing Se, etc., for example, for a long time, the cylindrical substrate 32 is continuously rotated. In the case of vapor depositing Al, etc. for a short time, the cylindrical substrate 32 is intermittently rotated. It is preferable that provision is made for at least one heater for the vapor supply source 31, which may independently or in succession supplied with an electric current.

As shown in FIG. 5, between the vapor supply source 31 and the mesh-shaped cylindrical substrate 32 is arranged a cylindrical shield member 33 which is provided at its top portion with an opening 34 through which is passed the vaporized substance to the mesh-shaped cylindrical substrate 32. The vaporized substance passed through the meshes of the mesh-shaped cylindrical substrate 32 is deposited on the upper wall surface of the bell jar 30, but is not deposited on the opposite surface of the mesh-shaped cylindrical substrate 32. The shield member 33 functions to prevent the mesh-shaped cylindrical substrate 32 from being coated with dust emitted from the vapor supply source 31, etc. Between that portion of the mesh-shaped cylindrical substrate 32 which is opposed to the opening 34 provided in the cylindrical shield member 33 and the bell jar 30 is arranged a temperature control means 35 for cooling or heating the mesh-shaped cylindrical substrate 32. The temperature control means 35 may be formed of an electric heating wire, a pipe for passing cooled or hot medium therethrough or a temperature regulating plate composed of these electric heating wire and pipe. In addition, a temperature control means 36 similar to the temperature control means 35 is arranged between the shield member 33 and the mesh-shaped cylindrical substrate 32. The temperature control means 36 is secured to that portion of the shield member 33 which is located in front of the opening 34 when viewed in the direction of rotation of the mesh-shaped cylindrical substrate 32 and functions to heat the mesh-shaped cylindrical substrate 32 prior to its arrival at the opening 34. It is preferable to separate the temperature control means 35 from the mesh-shaped cylindrical substrate 32 for the purpose of preventing the meshes of the mesh-shaped cylindrical substrate 32 from being clogged with the vaporized substance reflected by the temperature control means 35 toward the mesh-shaped cylindrical substrate 32. If the vapor supply source 31 is slightly moved downwardly to a position shown by the dotted lines, the substance vapor deposited over the surface of the mesh-shaped cylindrical substrate 32 becomes more uniform.

The invention is not limited to the embodiments described above, but various alternations and modifications are possible. For example, in the embodiment shown in FIG. 5, the mesh-shaped cylindrical substrate 32 is composed of a plurality of mesh-shaped cylindrical substrates 32A, 32B . . . and made integral into one elongate cylindrical substrate. Alternatively, one mesh-shaped substrate may be formed into a mesh-shaped cylindrical substrate. In addition, an elongate mesh-shaped cylindrical substrate may be vapor deposited with the vaporized substance and the elongate mesh-shaped cylindrical substrate with the vaporized substance deposited thereon may be cut into a plurality of mesh-shaped photosensitive screens. In addition, in the embodiments shown in the drawings, only one vapor supply source is used, but provision may be made of a plurality of vapor supply sources and each of these sources may be heated independently or in succession.

What is claimed is:

1. A device for manufacturing a photosensitive screen comprising a vacuum vapor deposition means for forming on a mesh-shaped electrically conductive substrate a photosensitive layer by vapor deposition under vacuum in said means, said vapor deposition means comprising a vapor supply source, means for supporting said mesh-shaped electrically conductive substrate above said vapor supply source along at least one portion of a circular plane having a center located at said vapor supply source, and a bell jar, said vapor supply source being arranged substantially at the center of said bell jar, said mesh-shaped substrate being supported by the supporting means substantially in the form of a cylinder with its surface to be vapor deposited facing inwards and rotatably supported about the center of the cylinder as a horizontal rotational axis.

2. The device according to claim 1 further and comprising a shield member interposed between said mesh-shaped substrate and said vapor supply source and provided at its top portion with an opening.

3. The device according to claim 2, wherein said shield member is provided at that portion thereof which is located in front of said opening in the direction of rotation of said mesh-shaped substrate with means for heat exchange with said mesh-shaped substrate.

4. The device according to claim 1 further and comprising means for heat exchange with said mesh-shaped substrate and arranged above said vapor supply source and interposed between said bell jar and said mesh-shaped substrate.

* * * * *